MANUAL OR AUTOMATIC TRANSISTOR R.F. GAIN CONTROL
SYSTEM UTILIZING A VOLTAGE CONTROLLED
VARIABLE RESISTANCE ELEMENT

Filed Jan. 28, 1964

INVENTORS
KARL H. ZENTMAIER
RICHARD F. POST
JAROSLAV A. SOUKUP

BY Browne, Schuyler and Beveridge
ATTORNEYS

United States Patent Office 3,303,428

Patented Feb. 7, 1967

3,303,428

MANUAL OR AUTOMATIC TRANSISTOR R.F. GAIN CONTROL SYSTEM UTILIZING A VOLTAGE CONTROLLED VARIABLE RESISTANCE ELEMENT

Karl Henry Zentmaier, Cranford, Richard Frank Post, Mountain Lakes, and Jaroslav A. Soukup, Nutley, N.J., assignors to Aircraft Radio Corporation, Boonton, N.J., a corporation of New Jersey Filed Jan. 28, 1964, Ser. No. 340,687
5 Claims. (Cl. 330—29)

This invention relates generally to control circuits for controlling the gain of transistor amplifiers, and, more particularly, to a combined R.F. gain control and automatic gain control circuit.

The principal obpect of the invention is to provide an improved transistor gain control system.

In transistor amplifier circuits control of the gain of the transistor by use of a variable resistance element such as a voltage sensitive diode is well known. In Rust Patent 2,224,699 an automatic gain control circuit is disclosed in which a diode in the cathode circuit of an amplifying tube has its impedance varied as a function of signal strength to control the amount of signal degeneration at the cathode thereof and thus the gain of the stage. This concept has been carried over into solid state circuits utilizing crystal diodes and transistor amplifiers. A direct current biased crystal diode in the emitter circuit of the transistor serves as a controlled impedance to the alternating current signal. The underlying mechanism is the voltage dependent forward resistance of the diode (see curve FIG. 3).

When such a diode is incorporated in an unbypassed fashion in the emitter circuit of the transistor amplifier, there is R.F. signal degeneration across the diode, the amount of degeneration being a function of the direct current voltage to the diode.

If the direct current voltage which is applied to the diode is a function of signal strength, such as the voltage from an automatic gain control (AGC) bus, then at low signal levels the AGC voltage on the gain control bus forward biases the diode so that it conducts and has a low impedance to signal currents flowing in the emitter circuit of the transistor. As the signal becomes stronger, however, the potential on the AGC bus changes in a direction to bias the diode into the higher impedance range of the curve shown in FIG. 3. The alternating current impedance of the diode for any given set of bias conditions is determined by the slope of a line tangent to the curve at the dynamic operating point thereof. The foregoing is substantially the transistor equivalent of the vacuum tube circuit shown in the aforementioned Rust patent.

The gain control voltage, whether it be a function of signal strength (automatic gain control voltage) or of a sensitivity adjustment (manual R.F. gain control), is applied to a diode in the emitter circuit of each of the transistors.

When operating under automatic gain control, the feedback loop automatically provides the proper control voltage. That is, when the gain control voltage applied to the diode is a function of the signal strength at a point beyond the controlled stages, the circuit is self-compensating in that there is a gradual "on" and "off" action in the gain controlled stages. In other words, the receiver does not go quickly from "on" to "off," but, rather, goes slowly from "on" to "off" in accordance with variations in the signal strength. However, when the gain control voltage is derived from a potentiometer, for example, a manually variable resistance, the diode which is controlled by the potentiometer voltage reaches the bottom of its curve very rapidly so there is no gradual or smooth transition from "on" to "off" of the stages on the R.F. gain control.

We have found that if the emitter of each transistor amplifier stage is supplied with a small bias current from a constant current direct current source in addition to the bias current supplied through the voltage sensitive diode impedance element, then each transistor amplifier stage is prevented from going immediately from "on" to "off" and the transistor stage goes from "on" to "off" in a gradual manner when the gain control voltage is changed.

A more complete understanding of the invention may be obtained from the study of the following description of a specic embodiment of the invention.

Figures 1, 2:
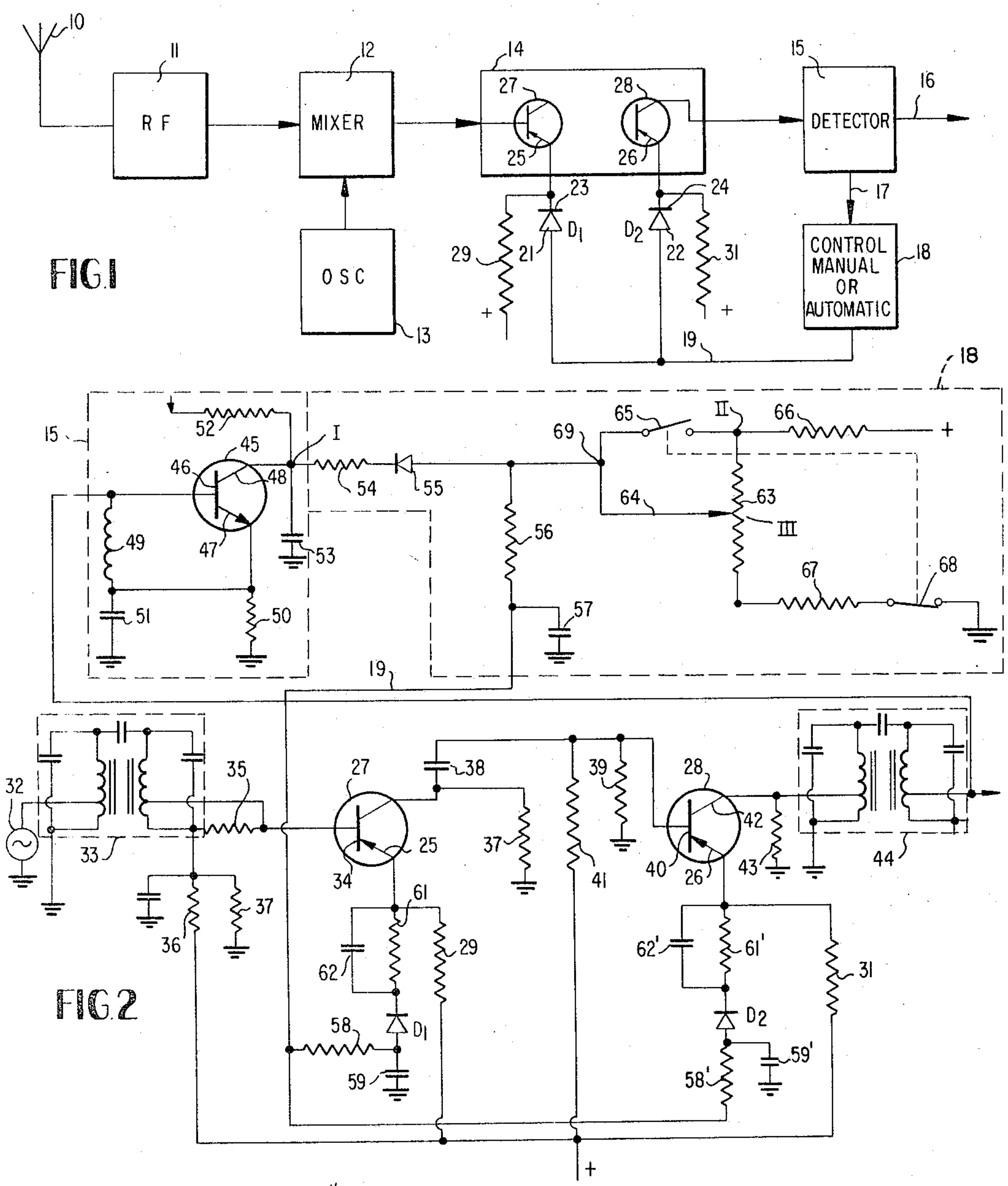
FIG. 1 is a partial block diagram of a radio receiver incorporating the invention.
FIG. 2 is a schematic diagram of two intermediate frequency stages to which the gain control system of the invention has been applied.

The portion of the block diagram shown in FIG. 1 includes an antenna 10 for collecting radio frequency energy and feeding same to a radio frequency amplifier 11. The output from radio frequency amplifier 11 is applied to a mixer circuit 12 where it is heterodyned with a signal from high frequency local oscillator 13 to produce an intermediate frequency IF signal which is applied to intermediate frequency amplifier 14. The intermediate frequency amplifier 14 may include many cascaded stages of amplification, two of which are shown in the block diagram. The different stages may, as is conventional, be coupled by various frequency selective and tuning devices not here pertinent. The output of intermediate frequency amplifier 14 is applied to a detector 15 which produces an output signal voltage on output lead 16 and a direct current voltage on output lead 17 which is an inverse function of signal strength (automatic gain control voltage). (If desired, other stages of detection may be employed, in parallel with detector 15, for example.) This voltage on lead 17 is applied through a control circuit 18 onto the gain control bus 19. The gain control bus 19 is common to all controlled stages of amplification. As shown in FIG. 1, diodes D1 and D2 are connected with their anodes 21 and 22, respectively, commonly tied to the gain control bus 19 and their cathodes 23 and 24 tied to the emitters 25 and 26, respectively, of transistor amplifiers 27 and 28, respectively. Large resistors 29 and 31 have one end tied to a source of positive potential (in the case of PNP transistors) so that these resistors, in effect, form constant current sources for supplying fixed bias currents to the emitter circuits of amplifying transistors 27 and 28 so as to prevent the degenerating effect of the diodes from rapidly turning the transistors 27 and 28 "on" and "off." These resistors 29 and 31 have the effect of smoothing out the relationship of the gain control potential applied to the diodes D1 and D2 and the resulting stage gains, of transistor stages 27 and 28. This will be explained more fully hereinafter.

Figure 3:
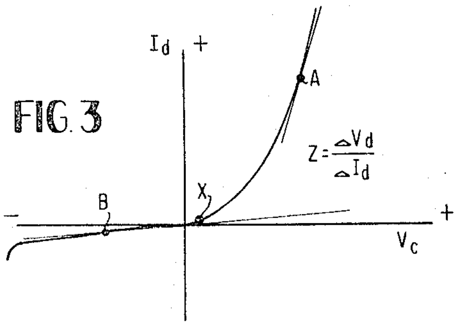
FIG. 3 is a diode characteristic curve showing a change in dynamic impedance Z with operating points.

FIG. 3 shows how a diode is used as a voltage controlled resistance so as to effect signal degeneration in the emitter circuits of transistors 27 and 28.

At low signal levels the diode is forward biased and its dynamic resistance is low as represented by the tangent $$\left(Z=\frac{1}{\text{slope}}=\frac{\Delta V_d}{\Delta I_d}\right)$$

to the operating point A of the curve of FIG. 3. There is practically no degeneration across the diode in the emitter circuit since the impedance (resistance) thereof is quite low (the diode is forward biased to signal energy).

As the direct current voltage on the gain control bus decreases, the diodes begin to conduct less and less and exhibit a much higher impedance as is represented by the operating point X of the curve of FIG. 3. This impedance is now much higher so that there is a large amount of signal degeneration in the emitter of the controlled stages since the diode is unbypassed at signal frequency. It will be seen therefore that the diode in the emitter circuit serves as a variable gain control resistance in the emitter circuits of the amplifying stages.

Referring now to the schematic circuit diagram of FIG. 2, RF signals from a source 32 are coupled through a tuned IF coupling transformer 33 to the base 34 of transistor 27. Resistor 35 connected in shunt with the lower section of the transformer secondary effects proper loading and impedance matching between the transformer and the base circuit of transistor 27. The base 34 of transistor 27 is supplied with a fixed bias potential from a voltage divider comprising resistors 36 and 37 which are supplied from the positive terminal of supply and ground.

Signals applied to base 34 of transistor 27 are amplified thereby and are developed across collector load resistor 37. The amplified signals are capacity coupled by capacitor 38 to the base 40 of transistor 28. The base 40 of transistor 28 is biased by a voltage developed by voltage divider comprising resistor 41 and resistor 39. Transistor 28 likewise amplifies the signal and develops an output voltage at the collector 42, across collector load resistor 43, which voltage is applied to tuned IF transformer 44. The output from IF transformer 44 is taken from the tapped section of secondary of the transformer 44. A portion of the output is applied to a detector circuit 15.

The detector circuit includes NPN transistor 45 having a base electrode 46, emitter electrode 47, and collector electrode 48. The base 46 emitter 47 circuit of transistor 45 is forward biased and rectifies and demodulates the modulated IF carrier signal. Inductor 49 is connected between the base and emitter circuits which serves as a high impedance to the IF frequency and a lower impedance to the audio frequency developed across resistor 50 which are reapplied to the base 46. The intermediate frequency signals induced in the secondary of transformer 44 is developed across inductor 49 at the base 46 of transistor 45. (It will be appreciated that there may be more stages of amplification between transformer 44 and detector 15.) Emitter resistor 50 is bypassed by capacitor 51 and positive operating potential is supplied to the collector 48 through collector resistor 52. The direct current voltage output appearing at collector 48 is a function of signal strength and is filtered by capacitor 53 and applied through a low value resistor 54 to a delay diode 55 which blocks the application of this voltage to the gain control bus 19 until the gain control potential is below the level set by control circuit 18.

When the voltage at the collector 48 of transistor 45 drops below the delay voltage established by delay diode 55, a potential is applied to the gain control bus 19 through filter circuit comprising resistor 56 and capacitor 57. The gain control voltage on gain control bus 19 is applied through filtering and decoupling resistors 58 and 58' to the anodes of gain control diodes D1 and D2, respectively. Capacitors 59 and 59' filter this voltage.

Emitter resistors 61 and 61' are bypassed by capacitors 62 and 62' and serve as emitter swamping resistors to minimize the effects of variations in the transistor emitter-base resistance caused by temperature variations.

The control circuit 18 includes a gain control potentiometer 63 and having a wiper 64 shunted by a switch 65. Control potentiometer 63 is connected in series circuit with small resistor 66 and resistor 67 through a gain control switch 68 across the positive supply terminal to ground. Switch 65 shorts out the manual gain control circuit so that there is no manual RF gain control. For weak signal levels this arrangement provides maximum receiver RF gain and is used in the compass position for automatic direction finding. Positive voltage is applied from source II to the anode of diodes D1 and D2 to forward bias them and minimize emitter degeneration. If higher RF signal levels are introduced collector 48 becomes less positive and the potential on bus 19 is reduced through delay diode 55. Thus RF gain is reduced protecting receiver stages from overload.

RF gain control switch 68 is open and switch 65 is closed when the receiver is operating as an automatic direction finder. When the receiver is operating in antenna and loop functions, the switch 68 is closed, switch 65 is open, and the RF gain control potentiometer 63 is operative to manually control the gain control voltage on gain control bus 19. The manual gain control may operate to establish the over-all sensitivity of the receiver. The automatic gain control circuit will still function, however, if the signal level at the AGC detector is sufficient to overcome AGC delay. (The signal level at the AGC detector is in this case a function of incoming signal level and potentiometer setting.)

When manual control of the RF gain of the receiver is desired, the gain control switch 68 is closed and switch 65 is opened so that current flows through resistor 66, RF gain control potentiometer 63 and resistor 67 so that a gain control potential appears on potentiometer wiper 64 and this voltage is coupled through resistor 56 and decoupling resistors 58 and 58' to change the direct current bias on diodes D1 and D2 in the emitter circuits of the transistors. Within the normal operating ranges of the variable impedance elements diodes D1 and D2, the gain control is effected through changes in potential on wiper 64 which changes the resistance or impedance of the diode elements to vary the amount of signal degeneration developed thereacross to thus vary the gain of each stage having the gain control applied thereto.

The gain control voltage on wiper 64 is coupled through RC coupling circuit 56, 57 to gain control bus 19 and through decoupling resistor and bypass capacitor 58–59 to the anode of the diode D1 and D2 to thus apply a direct current control potential to the diodes. Changes in the potential on wiper 64 change the direct current potential applied to all of the diodes to change the dynamic operating impedance of the diodes along the curve shown in FIG. 3. The voltage $V_d$ on FIG. 3 corresponds to the direct current voltage on gain control bus 19 so that as this voltage is changed, the alternating current impedance or resistance of diode D1 is changed. Inasmuch as the diodes D1 and D2 are unbypassed in any way, all the signal energy is constrained to pass through the diodes so that changes in the diode impedances are reflected as signal voltage drops thereacross (which are out of phase with the applied signal) and effectively change the bias between the emitter-base electrodes of the transistor in order to change the gain of the amplifier. Thus, the diode D1 controls the amount of emitter degeneration and the resistance of the diode is controlled by the voltage on the gain control bus 19.

In the broad range of operation of this circuit, the diodes D1 and D2 control the gain of the amplifier stages. However, as the diode impedance increases it increases substantially rapidly near the bottom or flat portion of the curve shown in FIG. 3 so that when at point B on the curve, the diode is substantially open circuited and its impedance is very high which results in a rapid "off" action of the transistor stage under control. In order to prevent this rapid "on"-"off" action when the bias on the diode changes from a forward bias to a reverse bias, we provide in parallel with the diode impedance a constant current source. This constant current source comprises a large resistor, such as resistors 29 and 31, which is directly tied at one end to the positive potential bus and at the other end directly to the emitter electrodes 25 and 26 of the transistors 27 and 28, respectively. These resistors are so large in relation to the other resistances and impedances in the circuit that the current flow through resistance 29 is substantially constant so that although diodes D1 and D2 are biased to a condition where they are open circuited, there is still a bias current supplied to the transistors 27 and 28 which prevents them from rapidly cutting off. The effect of resistors 29 and 31 is to give a smooth action to the RF gain control potentiometer 63. Thus, as the potentiometer wiper 64 is moved along the potentiometer 63, there is no sharp transition between "on" and "off" of transistors 27 and 28. As mentioned earlier, this action is not needed when the system is operating with an automatic gain control potential because the automatic gain control voltage, being a function of signal strength beyond the gain controlled stages, is self-compensating.

Thus, we have provided an improved gain control circuit which is amenable both to automatic gain control and smooth manual RF gain control which is achieved by a constant current source being tied directly to the emitter of the transistor stage being controlled.

In addition when the manual gain control circuit is in use, protection from overload is still afforded by the automatic gain control circuit which functions whenever the RF level at the automatic gain control detector reaches a level sufficient to cause collector 48 to become more negative than the voltage at 69 from control circuit 18. Automatic gain control delay diode 55 keeps the voltage on control bus independent of the RF signal until the signal level is sufficient to make collector 48 more negative than the voltage at 69 from control circuit 18. In this way diode 55 provides automatic gain control delay.

While we have described and illustrated a specific embodiment of our invention, it will be clear that variations of the circuit and arrangement thereof may be resorted to without departing from the true spirit and scope of the invention as defined in the appended claims.

We claim:

1. A gain control system for a transistor amplifier comprising
- a transistor having base, collector and emitter electrodes
  - means for applying operating potentials to the electrodes of said transistor including
  - a fixed forward bias potential on the base thereof and the emitter circuit of said transistor being common to the input and output signal circuits of said transistor
- a direct current voltage controlled diode in the emitter circuit of said transistor,
- a pair of variable direct current voltage sources,
  - the voltage of one of said variable direct current sources being a function of signal strength of the signal output of the amplifier and the voltage of the other of said variable direct current voltage sources being manually variable,
- a gain control bus commonly connecting said pair of variable direct current voltage sources to said direct current voltage controlled diode to vary the resistance thereof and the amount of signal degeneration thereat and direct current therethrough as a function of the voltage on said gain control bus
- a control switch means for enabling said manually variable source to control said gain control bus so that said manually variable source controls the voltage on said gain control bus,
- and a constant direct current source connected directly to the emitter electrode of said transistor,
- said constant current source including a resistor of such large magnitude that it determines the direct current flowing through it to maintain a bias voltage on the emitter of said transistor to assure a gradual transistion from "on" to "off" of said transistor.

2. A gain control system for a transistor amplifier comprising a plurality of transistor amplifier stages,
- each amplifier stage having a transistor having base, collector and emitter electrodes,
  - means for applying operating potential to the electrodes of said transistors including a fixed forward biased potential on the base of each transistor,
- each of said transistors being connected in common emitter configuration so that there is a signal path through the emitter which is common to the input and output circuits of said transistors,
- a plurality of direct current voltage controlled diodes, one in series with the emitter circuit of each of said transistors, respectively,
- a gain control bus commonly connected to an electrode of each of said diodes and controlling the resistance thereof and signal degeneration thereacross as a function of the direct current voltage on said gain control bus,
- a first source of variable direct current voltage, said first source of variable direct current voltage being variable as a function of signal strength of the signal output of the amplifier and constituting an automatic gain control voltage,
- a second variable direct current voltage source connected to said gain control bus, said second variable direct current voltage source being manually variable and constituting a manually variable gain control voltage,
- means connecting said first variable direct current voltage source to said gain control bus,
- switch means for enabling the manually variable direct current source so that said manually variable source controls the voltage on said gain control bus,
- and means for supplying constant direct current bias directly to the emitter electrodes of each of said transistors, respectively.

3. A gain control system for a transistor amplifier comprising a plurality of cascade connected transistor amplifier stages, each such amplifier stage comprising
- a transistor having base, collector and emitter electrodes and means for applying operating potential to the electrodes of the transistor including a fixed forward biased potential on the base thereof and the emitter circuits of the transistor being common to the input and output signal circuits of said transistor,
- a direct current voltage controlled semiconductor resistance element in the signal path of each emitter circuit in each of said transistor stages for controlling the gain of each of said transistors by varying the amount of signal degeneration at each emitter,
- a pair of variable direct current voltage sources, the voltage of one of said variable direct current voltage sources varying as a function of strength of signal at the output of the last stage of said transistor amplifier, and the other of said variable direct current voltage sources being manually variable,
- means commonly connecting said pair of variable direct current voltage sources to said semiconductor elements, respectively, to vary the resistance of same,
- a controlled circuit for disabling the manually variable source,
- and a plurality of constant direct current current sources connected directly to the emiter electrodes of each transistor stage, respectively,
- each of said direct current sources including a relatively large resistor for preventing the emitter circuit of each of said transistors from becoming reverse biased by a large input signal.

4. The amplifier circuit defined in claim 3 wherein said control circuit includes a diode in the circuit of said source varying as a function of signal strength for preventing application of said voltage to said bus until said voltage varying as a function of said signal strength is below a given value.

5. A gain control system for a radio receiver having at least one transistor amplifier stage, said stage comprising a transistor having base, collector and emitter electrodes and means supplying operating potential to the electrodes of the transistor, direct current voltage controlled first diode means in the emitter circuit of said transistor stage to control signal degeneration thereat and simultaneously the power gain of said transistor in response to changes in direct current voltage applied thereto;

a gain control bus connected to said controlled diode element;

a first source of gain control voltage derived from the output of said amplifier and varying as a function of signal inputs;

a second diode means for applying said first source of control potential to said gain control bus when the magnitude of potential of said first source is below a given level, a manually variable second source of gain control voltage, said second source being applied to the said gain control bus at the same point as said gain control voltage is applied to said gain control bus, switch means rendering said manually variable second source operative to control the gain of said amplifier, and a constant current direct current source connected directly to the emitter electrode of the transistor so that when said manually variable second source of gain control voltage is varied there is no rapid change in the conduction and gain characteristics of said amplifier stage.

References Cited by the Examiner

UNITED STATES PATENTS

| | | | |
|---|---|---|---|
| 2,749,394 | 6/1956 | Person et al. | 330—95 X |
| 3,032,704 | 5/1962 | Beck | 330—145 X |
| 3,094,675 | 6/1963 | Ule | 330—110 |
| 3,163,828 | 12/1964 | Fine | 330—28 X |
| 3,176,238 | 3/1965 | Dickerson | 325—401 X |

OTHER REFERENCES

Hurley: "Designing Transistor Circuits, Automatic Gain Control," Electronic Equipment, June 1957, pages 22–25.

ROY LAKE, *Primary Examiner.*

R. P. KANANEN, J. B. MULLINS, *Assistant Examiners.*